(12) United States Patent
Liu et al.

(10) Patent No.: US 12,237,441 B2
(45) Date of Patent: Feb. 25, 2025

(54) LIGHT-EMITTING DEVICE AND METHOD FOR MANUFACTURING THE SAME

(71) Applicant: XIAMEN SAN'AN OPTOELECTRONICS CO., LTD., Fujian Province (CN)

(72) Inventors: Xiaoliang Liu, Fujian (CN); Xiushan Zhu, Fujian (CN); Min Huang, Fujian (CN); Gaolin Zheng, Fujian (CN); Anhe He, Fujian (CN); Kang-Wei Peng, Fujian (CN); Su-Hui Lin, Fujian (CN)

(73) Assignee: XIAMEN SAN'AN OPTOELECTRONICS CO., LTD., Fujian Province (CN)

( * ) Notice: Subject to any disclaimer, the term of this patent is extended or adjusted under 35 U.S.C. 154(b) by 113 days.

(21) Appl. No.: 17/464,355

(22) Filed: Sep. 1, 2021

(65) Prior Publication Data

US 2022/0069170 A1    Mar. 3, 2022

(30) Foreign Application Priority Data

Sep. 3, 2020    (CN) .......................... 202010913769.8

(51) Int. Cl.
*H01L 33/38* (2010.01)
*H01L 33/24* (2010.01)
(Continued)

(52) U.S. Cl.
CPC .............. *H01L 33/46* (2013.01); *H01L 33/24* (2013.01); *H01L 33/42* (2013.01); *H01L 2933/0016* (2013.01); *H01L 2933/0025* (2013.01)

(58) Field of Classification Search
CPC ....................................................... H01L 33/382
(Continued)

(56) References Cited

U.S. PATENT DOCUMENTS

| 2017/0250314 A1* | 8/2017 | Ishiguro ................ H01L 33/405 |
| 2018/0138372 A1* | 5/2018 | Kim ......................... H01L 33/32 |
| 2020/0295229 A1* | 9/2020 | Kim ........................ H01L 33/382 |

FOREIGN PATENT DOCUMENTS

| CN | 102130265 A | 7/2011 |
| CN | 102629653 A | 8/2012 |

OTHER PUBLICATIONS

Search Report appended to an Office Action, which was issued to Chinese counterpart application No. 202010913769.8 by the CNIPA on Jun. 15, 2021.

* cited by examiner

*Primary Examiner* — Hsin Yi Hsieh
(74) *Attorney, Agent, or Firm* — MUNCY, GEISSLER, OLDS & LOWE, P.C.

(57) ABSTRACT

A light-emitting device includes: a light-emitting mesa structure having a first top surface and a peripheral surface connected to the first top surface; a transparent conductive layer that is disposed on the first top surface and that has a second top surface; a first insulating structure that is at least disposed on the peripheral surface and that has a third top surface and an inner tapered surface indented from the third top surface, the inner tapered surface having an acute angle with respect to the second top surface; and a reflective layer that is disposed on the transparent conductive layer and that has a first side surface in contact with the inner tapered surface. A method for manufacturing the light-emitting device is also disclosed.

15 Claims, 15 Drawing Sheets

(51) Int. Cl.
*H01L 33/42* (2010.01)
*H01L 33/46* (2010.01)
(58) Field of Classification Search
USPC .......................................................... 257/98
See application file for complete search history.

LIGHT-EMITTING DEVICE AND METHOD FOR MANUFACTURING THE SAME

CROSS-REFERENCE TO RELATED APPLICATION

This application claims priority of Chinese Invention Patent Application No. 202010913769.8, filed on Sep. 3, 2020.

FIELD

The disclosure relates to semiconductor solid-state lighting, and more particularly to a light-emitting device and a method for manufacturing the same.

BACKGROUND

A lateral structure in which a p-n junction of a light-emitting diode (LED) is connected to two opposite electrodes of a lead frame by gold wires is usually adopted for commercialized light-emitting diode (LED) package. However, an LED configured as the lateral structure (i.e., a lateral LED) is prone to failure due to higher light attenuation, higher light quenching and lower heat dissipation, etc., and thus, development of such lateral structure is limited. Therefore, a vertical structure and a flip-chip structure are developed to replace the lateral structure for LED configuration.

In comparison to the lateral LED, heat dissipation efficiency of a vertical LED is improved. To be specific, the vertical LED has an epitaxial structure and two electrodes that are disposed on two opposite sides of the epitaxial structure, respectively. Hence, current injected from one of the electrodes flows almost vertically rather than horizontally through the epitaxial structure, so that a localized high temperature of the epitaxial structure would be avoided.

In comparison to the lateral LED, a flip-chip LED is suitable for integration with other electronic components and for mass production. A method for manufacturing the flip-chip LED is relatively simple and yield of the same is favorable in mass production. To be specific, the flip-chip LED includes a p-n junction that is directly eutectic bonded to electrodes on a sub-mount instead of being connected thereto using gold wires, thereby minimizing failure caused by light quenching. Furthermore, the flip-chip structure also demonstrates great improvement in heat dissipation.

However, regardless of the vertical LED or the flip-chip LED, each of which has a reflective layer that is easy to be peeled off and has insufficient coverage. Hence, there is still room for improvement in the LED structure.

SUMMARY

Therefore, an object of the disclosure is to provide a light-emitting device that can alleviate or eliminate at least one of the drawbacks of the prior art.

According to an aspect of the disclosure, a light-emitting device includes a light-emitting mesa structure, a transparent conductive layer, a first insulating structure, and a reflective layer.

The light-emitting mesa structure has a first top surface and a peripheral surface connected to the first top surface.

The transparent conductive layer is disposed on the first top surface of the light-emitting mesa structure, and has a second top surface.

The first insulating structure is at least disposed on the peripheral surface of the light-emitting mesa structure, and has a third top surface and an inner tapered surface that is indented from the third top surface. The inner tapered surface has an acute angle with respect to the second top surface of the transparent conductive layer.

The reflective layer is disposed on the transparent conductive layer, and has a first side surface in contact with the inner tapered surface of the first insulating structure.

According to another aspect of the disclosure, a method for manufacturing a light-emitting device includes the steps of: providing a light-emitting mesa structure having a first top surface and a peripheral surface connected to the first top surface; disposing a transparent conductive layer on the first top surface of the light-emitting mesa structure; forming an insulating unit on the peripheral surface of the light-emitting mesa structure and on the transparent conductive layer to expose a portion of the transparent conductive layer; and disposing a reflective layer on the insulating unit and the exposed portion of the transparent conductive layer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
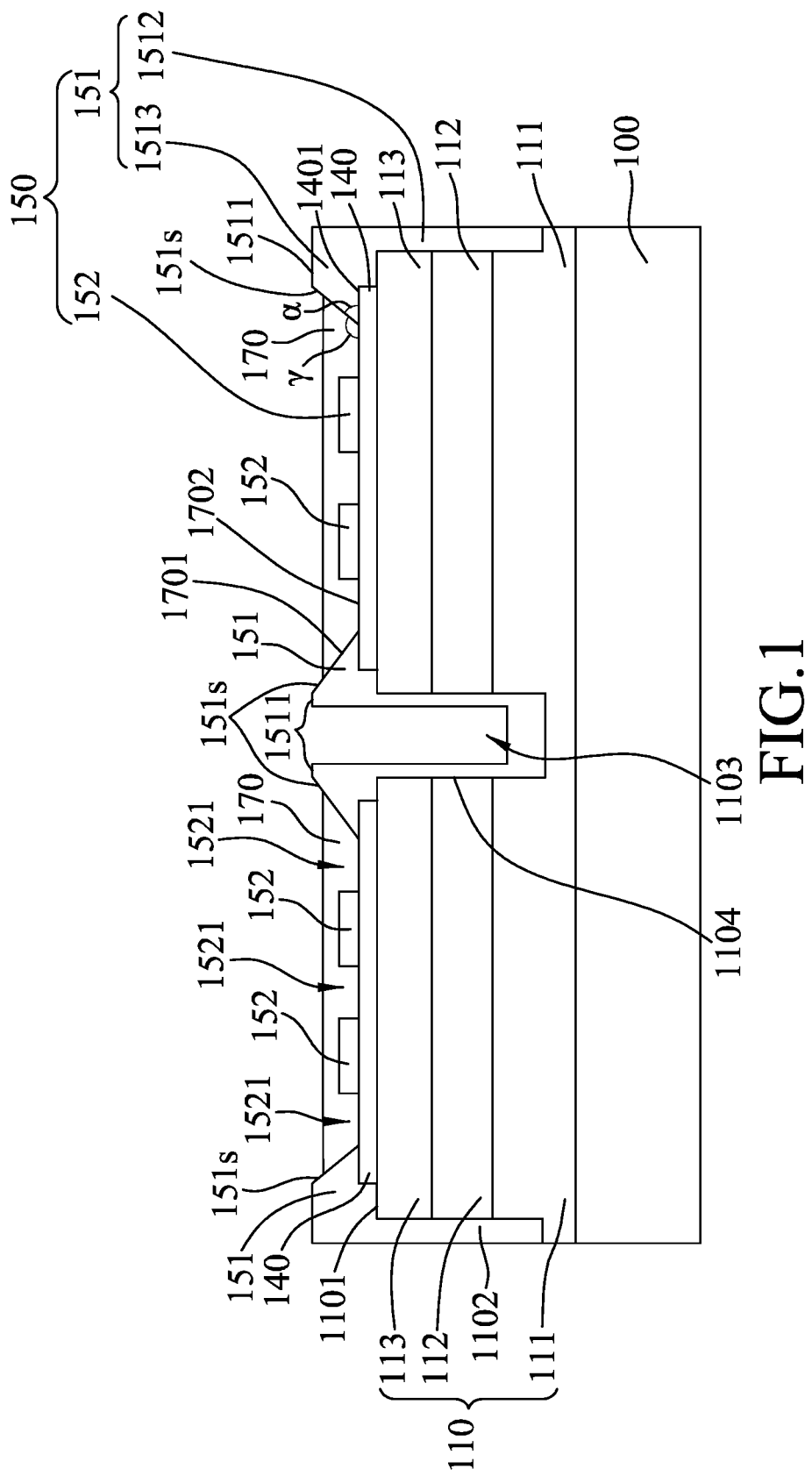
FIG. 1 is a schematic view illustrating a first embodiment of a light-emitting device of the disclosure.

Before the disclosure is described in greater detail, it should be noted that where considered appropriate, refer-

Embodiment 1

Referring to FIGS. 1 to 4, a first embodiment of a light-emitting device of the disclosure includes a substrate 100, a light-emitting mesa structure 110, a transparent conductive layer 140, an insulating unit 150 that includes a first insulating structure 151 and a second insulating structure 152, and a reflective layer 170.

Referring to FIG. 1, the light-emitting mesa structure 110 is disposed on the substrate 100, and has a first top surface 1101 and a peripheral surface 1102 connected to the first top surface 1101. The light-emitting mesa structure 110 includes a first type semiconductor layer 111 disposed on the substrate 100, an active layer 112 disposed on the first type semiconductor layer 111, and a second type semiconductor layer 113 that is disposed on the active layer 112 opposite to the first type semiconductor layer 111 and that defines the first top surface 1101 opposite to the active layer 112.

In this embodiment, the transparent conductive layer 140 is disposed on the first top surface 1101 of the light-emitting mesa structure 110 to expose a portion of the first top surface 1101 of the light-emitting mesa structure 110, and has a second top surface 1401.

The first insulating structure 151 is at least disposed on the peripheral surface 1102 of the light-emitting mesa structure 110. In this embodiment, the first insulating structure 151 has a main portion 1512 that surrounds the peripheral surface 1102 of the light-emitting mesa structure 110, and a lateral portion 1513 that extends from the main portion 1512. The lateral portion 1513 is disposed on the exposed portion of the first top surface 1101 of the light-emitting mesa structure 110, and is peripherally disposed on the second top surface 1401 of the transparent conductive layer 140. The first insulating structure 151 has a third top surface 1511 and an inner tapered surface 151s indented from the third top surface 1511. The lateral portion 1513 defines the inner tapered surface 151s. The inner tapered surface 151s has an acute angle (a) with respect to the second top surface 1401 of the transparent conductive layer 140.

The reflective layer 170 is disposed on the transparent conductive layer 140, and has a first side surface 1701 in contact with the inner tapered surface 151s of the first insulating structure 151 and a first bottom surface 1702 that is in contact with the second top surface 1401 of the transparent conductive layer 140 and that is connected to the first side surface 1701. Since the first side surface 1701 of the reflective layer 170 is in contact with the inner tapered surface 151s of the first insulating structure 151, and since the inner tapered surface 151s has an acute angle (a) with respect to the second top surface 1401 of the transparent conductive layer 140, the first side surface 1701 of the reflective layer 170 has an obtuse angle (y) with respect to the first bottom surface 1702 of the reflective layer 170. In other words, the acute angle (a) and the obtuse angle (y) are supplementary angles when the second top surface 1401 of the transparent conductive layer 140 is flat.

In this embodiment, the inner tapered surface 151s of the first insulating structure 151 cooperates with the second top surface 1401 of the transparent conductive layer 140 to define a funnel-like space. The reflective layer 170 that is disposed in the funnel-like space is surrounded by the first insulating structure 151, and the first side surface 1701 of the reflective layer 170 is in intimate contact with the inner tapered surface 151s of the first insulating structure 151. In other words, the reflective layer 170 has a cross-sectional shape of an inverted trapezoid, as shown in FIG. 1. Accordingly, adhesion of the reflective layer 170 to the first insulating structure 151 is improved by such connection between the first insulating structure 151 and the reflective layer 170, thereby end warping or peeling of the reflective layer 170 from the first insulating structure 151 can be greatly reduced.

In this embodiment, the second insulating structure 152 is disposed on the transparent conductive layer 140 to be connected to the first insulating structure 151, and is formed with a plurality of through-holes 1521 to expose the transparent conductive layer 140. The reflective layer 170 extends through the through-holes 1521 to be electrically connected to the transparent conductive layer 140, and cooperates with the second insulating structure 152 to form an omni-directional reflector (ODR). It is noted that FIG. 1 illustrates a cross-sectional view of the light-emitting device with the through-holes 1521 located between the first insulating structure 151 and the second insulating structure 152.

Figure 2:
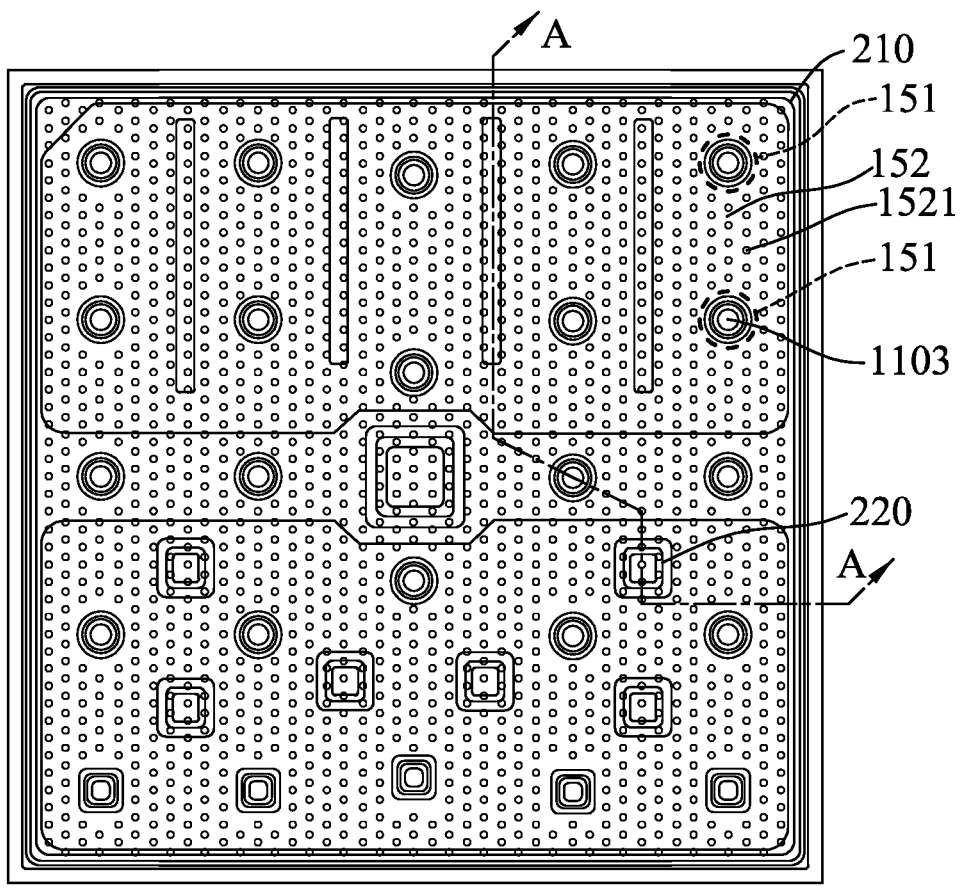
FIG. 2 is a top view of the first embodiment of the light-emitting device that is configured as a flip-chip structure.

FIG. 2 is a top view illustrating a positional relationship of the first and second insulating structures 151, 152 of the light-emitting device configured as a flip-chip structure. The two dashed circles represent boundaries between the first and second insulating structures 151, 152. The first insulating structure 151 is located inside the dashed circles while the second insulating structure 152 is located outside the dashed circles. The first and second insulating structures 151, 152 are clearly formed in the same insulating layer.

In this embodiment, the first and second insulating structures 151, 152 may be made of an insulating dielectric material selected from one of silicon nitride and silicon oxide, but is not limited thereto. The reflective layer 170 may be made of a metallic material selected from one of platinum (Pt), titanium-tungsten alloys (TiW), silver (Ag), and combinations thereof, so as to form as a metallic single-layer structure or a metallic multi-layered structure. Among the abovementioned metallic materials, the reflective layer 170 made of Ag has a relatively high reflectivity up to 96%. Hence, in an example of this embodiment, reflectivity of the light-emitting device is greatly improved by the reflective layer 170 made of Ag and the ODR cooperatively defined by the second insulating structure 152 and the reflective layer 170, which increases brightness of a final product including the light-emitting device.

In this embodiment, the second insulating structure 152 has a thickness less than a maximum thickness of the first insulating structure 151. The thickness of the second insulating structure 152 may range from 200 nm to 1200 nm. In some embodiments, the thickness of the second insulating structure 152 may range from 300 nm to 6000 nm.

In this embodiment, each of the through-holes 1521 of the second insulating structure 152 has a hole size ranging from 2 μm to 50 μm. In some embodiments, the hole size may range from 6 μm to 20 μm. For example, the hole size may be 6 μm, 10 μm or 20 μm.

In this embodiment, the reflective layer 170 has a thickness larger than that of the second insulating structure 152 so as to ensure complete coverage of the second insulating structure 152 with the reflective layer 170 and the formation of the ODR, accordingly. In some embodiments, the second insulating structure 152 has a thickness less than two-thirds of the maximum thickness of the first insulating structure 151. In some embodiments, the thickness of the second insulating structure 152 ranges from one-third to two thirds of the maximum thickness of the first insulating structure 151. In some embodiments, the thickness of the second insulating structure is less than one-half of the maximum thickness of the first insulating structure 151. Furthermore, the thickness of the reflective layer 170 is no greater than the maximum thickness of the first insulating structure 151 to ensure that the first side surface 1701 of the reflective layer 170 is inclined and entirely covered by the inner tapered surface 151s of the first insulating structure 151. Consequently, adhesion between the reflective layer 170 and the first insulating structure 151 can be improved, and end warping and peeling of the reflective layer 170 from the first insulating structure 151 is avoidable.

In some embodiments, the thickness of the reflective layer 170 may be less than that of the second insulating structure 152, so that the reflective layer 170 is disposed on the second insulating structure 152 conformably and extends along a sidewall of each of the through-holes 1521 to be electrically connected to the transparent conductive layer 140.

It is noted that a contact area between the reflective layer 170 and the transparent conductive layer 140 is usually smaller than that between the second insulating structure 152 and the transparent conductive layer 140. In this embodiment, the contact area between the reflective layer 170 and the transparent conductive layer 140 ranges from 3% to 50% of a light-emitting diode (LED) chip area, which is almost equal to an area of the transparent conductive layer 140. In some embodiments, the contact area between the reflective layer 170 and the transparent conductive layer 140 ranges from 5% to 20% of the LED chip area. In an example, the contact area between the reflective layer 170 and the transparent conductive layer 140 is 10% of the LED chip area.

In this embodiment, the light-emitting mesa structure 110 is formed with a plurality of trenches 1103 that are indented from the first top surface 1101 of the light-emitting mesa structure 110. In this embodiment, each of the trenches 1103 extends through the second type semiconductor layer 113 and the active layer 112 and terminates at the first type semiconductor layer 111. Furthermore, each of the trenches 1103 has an inner sidewall 1104 connected to the first top surface 1101. The first insulating structure 151 is further disposed on the inner sidewall 1104 of each of the trenches 1103.

Figure 3:
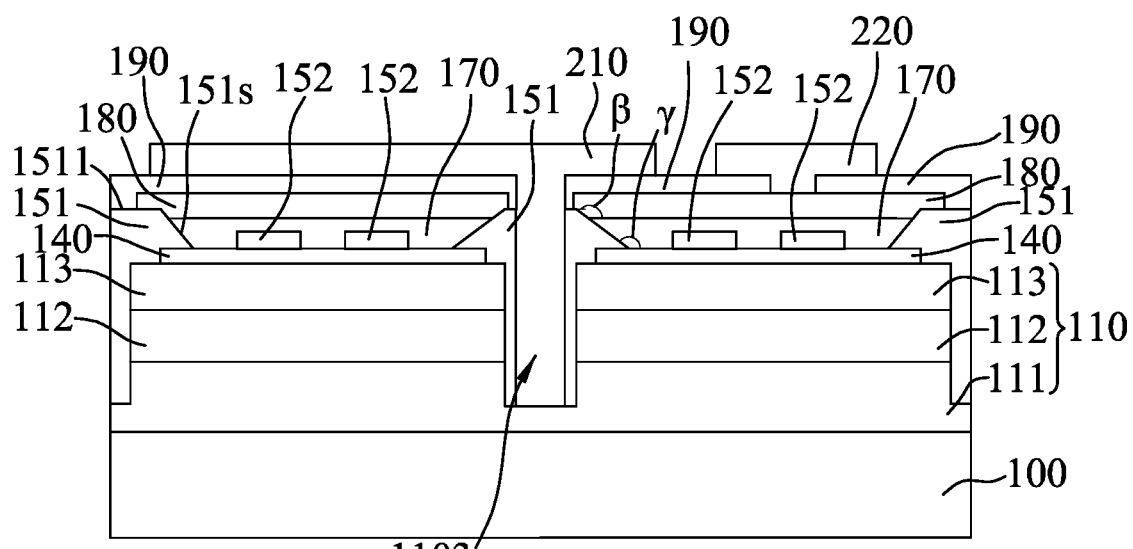
FIG. 3 is a cross-sectional view taken along line A-A of FIG. 2.

Referring to FIGS. 2 and 3, the first embodiment of the light-emitting device is configured as the flip-chip structure. The light-emitting device further includes a barrier layer 180, a passivation layer 190, a first electrode 210 and a second electrode 220.

The barrier layer 180 is disposed on the reflective layer 170 to be in contact with the third top surface 1511 of the first insulating structure 151 and the inner tapered surface 151s so as to avoid current leakage caused by thermal diffusion or electromigration of Ag or aluminum (Al) in the reflective layer 170. The barrier layer 180 may be made of a metallic material selected from one of titanium (Ti), platinum (Pt), nickel (Ni), gold (Au), and combinations thereof, so as to form as a metallic single-layer structure or a metallic multi-layered structure.

The passivation layer 190 is disposed on the barrier layer 180 and the third top surface 1511 of the first insulating structure 151 exposed from the barrier layer 180 to expose a portion of the barrier layer 180 for the second electrode 220 to be electrically connected to the barrier layer 180.

The first electrode 210 is disposed on the passivation layer 190, and extends through the trenches 1103 to be electrically connected to the first type semiconductor layer 111. The second electrode 220 is disposed on the passivation layer 190 to be separated from the first electrode 210, and extends through the passivation layer 190 to be electrically connected to the exposed portion of the barrier layer 180.

In this embodiment, the substrate 100 is made of sapphire (i.e., aluminum oxide, $Al_2O_3$).

In this embodiment, the first type semiconductor layer 111 may be made of an n-type gallium nitride-based (GaN-based) material or an n-type aluminum gallium indium phosphide-based (AlGaInP-based) material. The active layer 112 may be a quantum well including an indium nitride-based layer having a relatively narrow energy bandgap being alternately stacked with a nitride-based layer having a relatively wide energy bandgap. The second type semiconductor layer 113 may be made of a p-type GaN-based material or a p-type AlGaInP-based material. The transparent conductive layer 140 may be made of indium tin oxide (ITO), zinc oxide (ZnO) or aluminum-doped zinc oxide (AZO).

Figure 4:
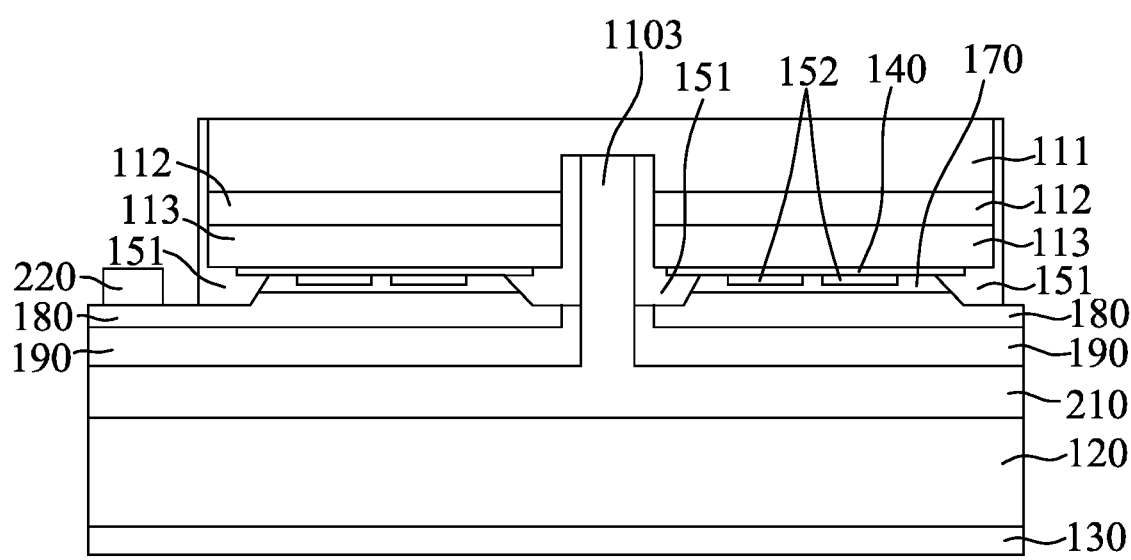
FIG. 4 is a cross-sectional view illustrating the first embodiment of the light-emitting device that is configured as a vertical structure.

In some embodiments, the light-emitting device may be configured as a vertical structure, as shown in FIG. 4. The light-emitting device configured as the vertical structure further includes a conductive substrate 120 bonded to the first electrode 210, and a backside electrode 130 disposed on the conductive substrate 120 opposite to the first electrode 210. The conductive substrate 120 may be in the form of a silicon substrate or germanium substrate, but is not limited thereto.

A method for manufacturing the first embodiment of the light-emitting device includes consecutive steps Sa to Sd, as shown in FIGS. 5 to 8 and FIG. 1.

In step Sa, the light-emitting mesa structure 110 that has the first top surface 1101 and the peripheral surface 1102 connected to the first top surface 1101 and that is disposed on the substrate 100 is provided. In this embodiment, a plurality of the trenches 1103 are formed to be indented from the first top surface 1101 of the light-emitting mesa structure 110. Each of the trenches 1103 have the inner sidewall 1104 and a bottom 1105 connected to the inner sidewall 1104.

Figure 5:
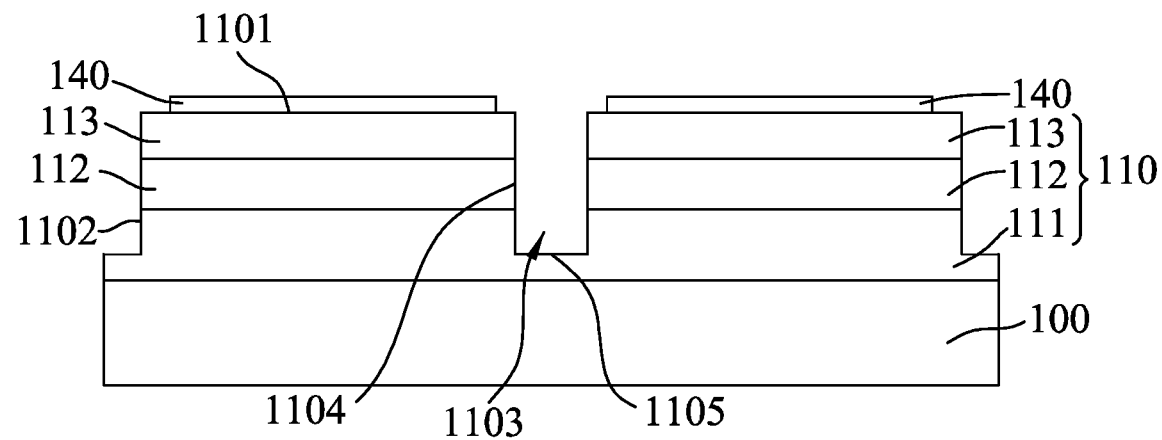
FIGS. 5 to 8 are schematic views illustrating consecutive steps of a method for manufacturing the first embodiment of the light-emitting device.

In step Sb, the transparent conductive layer 140 is disposed on the first top surface 1101 of the light-emitting mesa structure 110, as shown in FIG. 5. To be specific, a transparent conductive material for making the transparent conductive layer 140 is disposed on the second type semiconductor layer 113 by a thin film deposition process. Then, a thermal treatment is performed to form an ohmic contact between the transparent conductive material and the second type semiconductor layer 113. In this embodiment, the transparent conductive material is patterned by photolithography to form the transparent conductive layer 140 that exposes a portion of the first top surface 1101 of the light-emitting mesa structure 110 adjacent to the peripheral surface 1102 of the light-emitting mesa structure 110 and the inner sidewall 1104 of each of the trenches 1103.

In step Sc, the insulating unit 150 is formed on the peripheral surface 1102 of the light-emitting mesa structure 110 and on the transparent conductive layer 140 to expose a portion of the transparent conductive layer 140. To be specific, the formation of the insulating unit 150 further includes consecutive steps Sc-1 to Sc-4.

In step Sc-1, an insulating layer is at least disposed on the peripheral surface 1102 of the light-emitting mesa structure 110 and the transparent conductive layer 140. In this embodiment, the insulating layer is conformably disposed on the peripheral surface 1102 of the light-emitting mesa structure 110, the exposed portion of the first top surface 1101 of the light-emitting mesa structure 110, the transparent conductive layer 140, the inner sidewall 1104 and the bottom 1105 of each of the trenches 1103 by the thin film deposition process.

Figure 6:
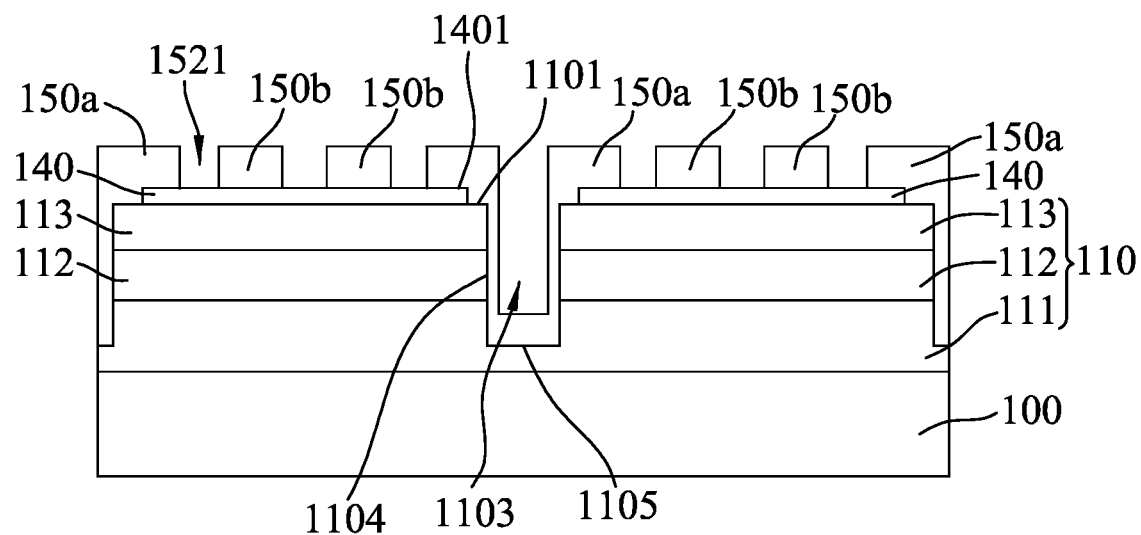

In step Sc-2, the insulating layer is patterned by photolithography to form a plurality of the through-holes 1521 therein to expose the transparent conductive layer 140, as shown in FIG. 6. The patterned insulating layer includes a first portion 150a and a second portion 150b. The first portion 150a is disposed on the peripheral surface 1102 of the light-emitting mesa structure 110, the exposed portion of the first top surface 1101 of the light-emitting mesa structure 110, the inner sidewall 1104 and the bottom 1105 of each of the trenches 1103. The first portion 150a is further peripherally disposed on the second top surface 1401 of the transparent conductive layer 140. The second portion 150b is disposed on the transparent conductive layer 140 to be connected to the first portion 150a, and is formed with the through-holes 1521. The through-holes 1521 have a total area ranging from 3% to 50% of an area of the insulating layer prior to patterning which is almost equal to the LED chip area. In some embodiments, the total area of the through-holes 1521 ranges from 5% to 20% of the area of the insulating layer prior to patterning. In an example, the total area of the through-holes 1521 is 10% of the area of the insulating layer prior to patterning.

Figure 7:
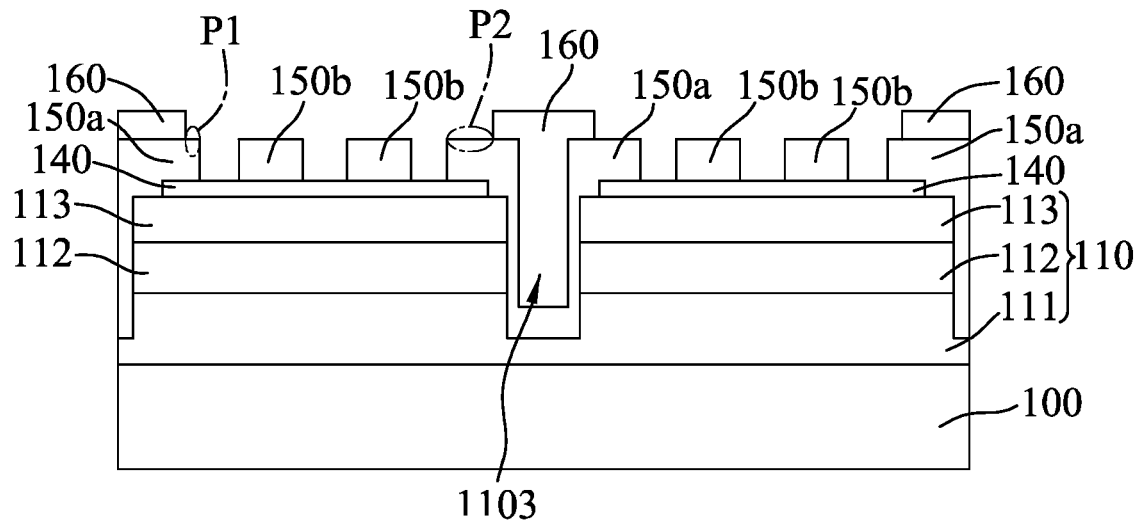

In step Sc-3, a mask layer 160 is applied on the first portion 150a of the patterned insulating layer, as shown in FIG. 7. To be specific, the mask layer 160 is applied on the first portion 150a of the patterned insulating layer in a manner that exposes a part of the first portion 150a in position above the transparent conductive layer 140, as shown by areas P1 and P2 in FIG. 7, and is filled in the trenches 1103. Yet, the second portion 150b of the patterned insulating layer is not covered by the mask layer 160. In this embodiment, the mask layer 160 may be made of a photoresist that is able to be patterned by exposure and development.

Figure 8:
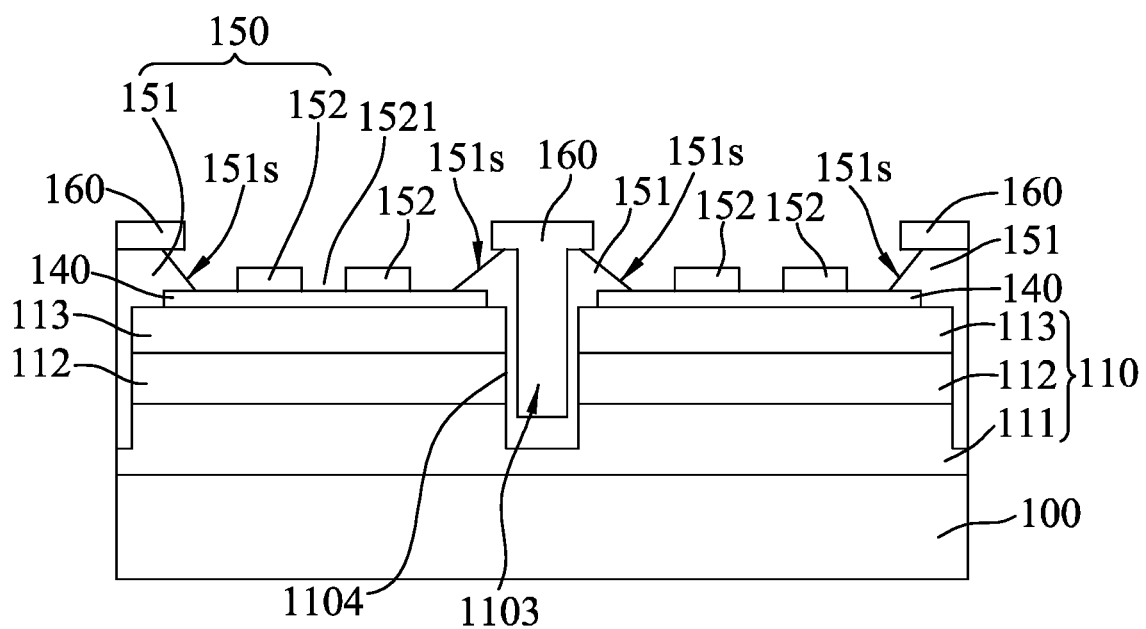

In step Sc-4, the patterned insulating layer is etched along the mask layer 160 to form the second insulating structure 152 and the first insulating structure 151 that surrounds the second insulating structure 152 and that is connected to the second insulating structure 152. In this embodiment, the first insulating structure 151 is also formed on the inner sidewall 1104 of each of the trenches 1103, as shown in FIG. 8. The etching process may be a wet etching process performed using buffered oxide etch (BOE) solution. To be specific, because the wet etching process is isotropic, the exposed part of the first portion 150a, i.e., the areas P1 and P2 shown in FIG. 7, and another part of the first portion 150a underneath the mask layer 160 are inevitably laterally etched so as to form the inner tapered surface 151s of the first insulating structure 151. The second portion 150b without being covered by the mask layer 160 is etched so as to form the second insulating structure 152 which has a thickness less than that of the first insulating structure 151 and which has the through-holes 1521 to expose the transparent conductive layer 140.

In step Sd, the reflective layer 170 is disposed on the first and second insulating structures 151, 152 and the exposed portion of the transparent conductive layer 140 so as to be electrically connected to the transparent conductive layer 140, as shown in FIG. 1. In this embodiment, the reflective layer 170 may serve as a silver mirror. Specifically, the reflective layer 170 may be made of Ag, and may be deposited by chemical vapor deposition (CVD) or evaporative physical vapor deposition (PVD) on the first and second insulating structures 151, 152 and in the through-holes 1521.

The reflective layer 170 that cooperates with the second insulating structure 152 to form an omni-directional reflector (ODR) may significantly increase brightness of a final product including the light-emitting device.

In this embodiment, after step Sd, the method for manufacturing the light-emitting device further includes removing the mask layer 160.

In this embodiment, the method for manufacturing the light-emitting device further includes disposing the barrier layer 180 on the reflective layer 170, disposing the passivation layer 190 on the barrier layer 180 and the first insulating structure 151, and disposing the first and second electrodes 210, 220 that are spaced apart from each other to be electrically connected to the first type semiconductor layer 111 and the barrier layer 180, respectively, as shown in FIG. 3. Configuration of the first insulating structure 151, the barrier layer 180, the passivation layer 190, and the first and second electrodes 210, 220 is adjustable based on a packaged type, for example, a flip-chip structure or a vertical structure.

Embodiment 2

Figure 9:
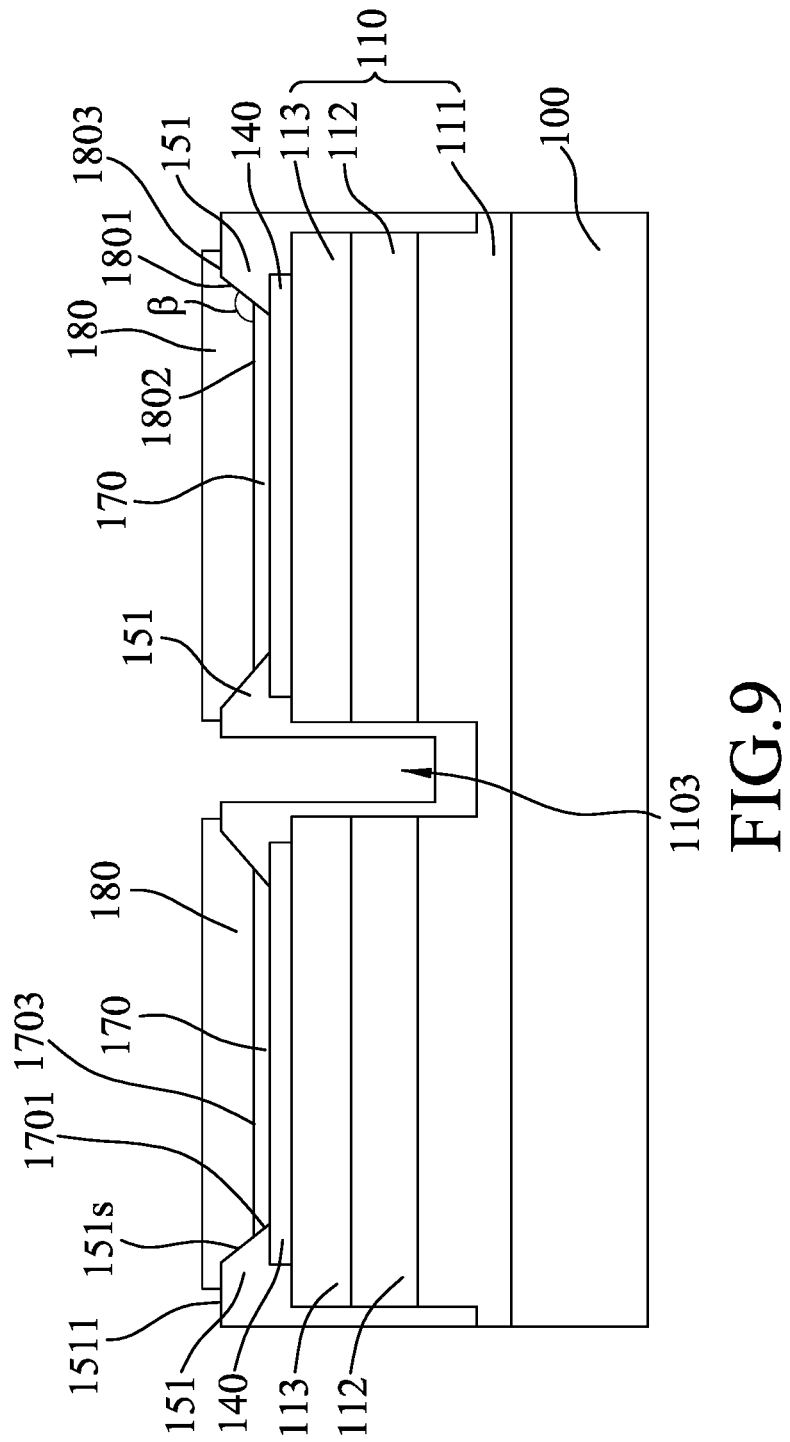
FIG. 9 is a schematic view illustrating a second embodiment of the light-emitting device of the disclosure.
Figure 10:
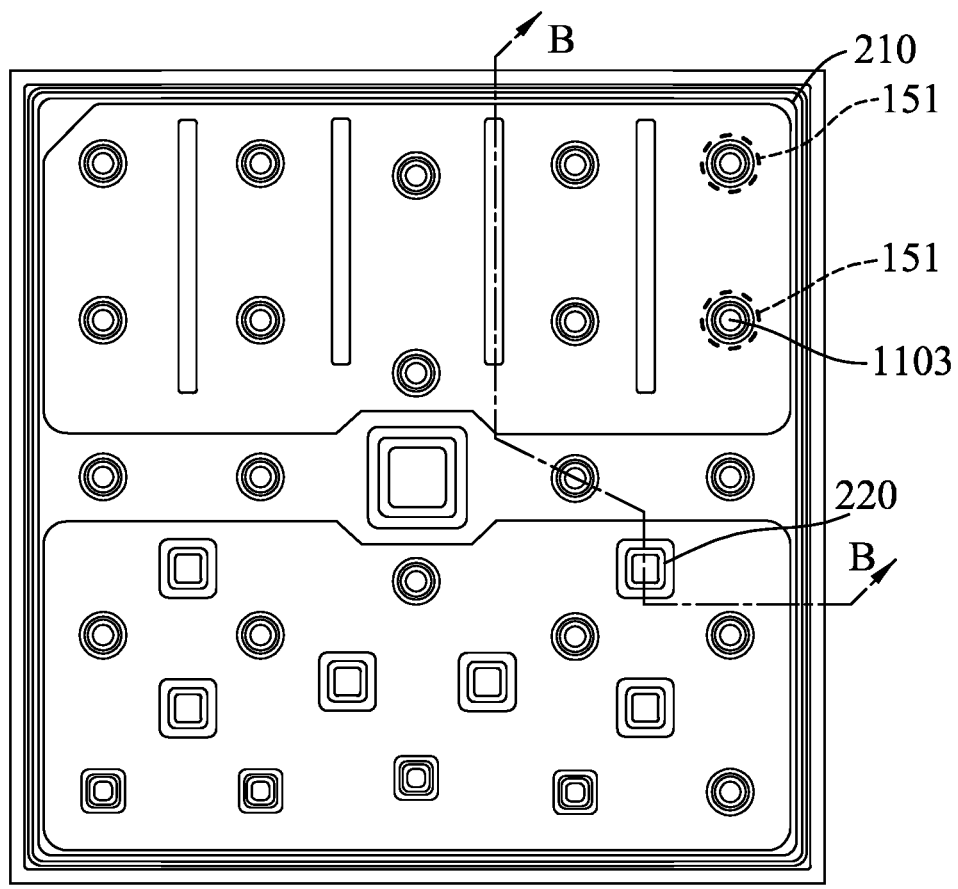
FIG. 10 is a top view of the second embodiment of the light-emitting device that is configured as a flip-chip structure.
Figure 11:
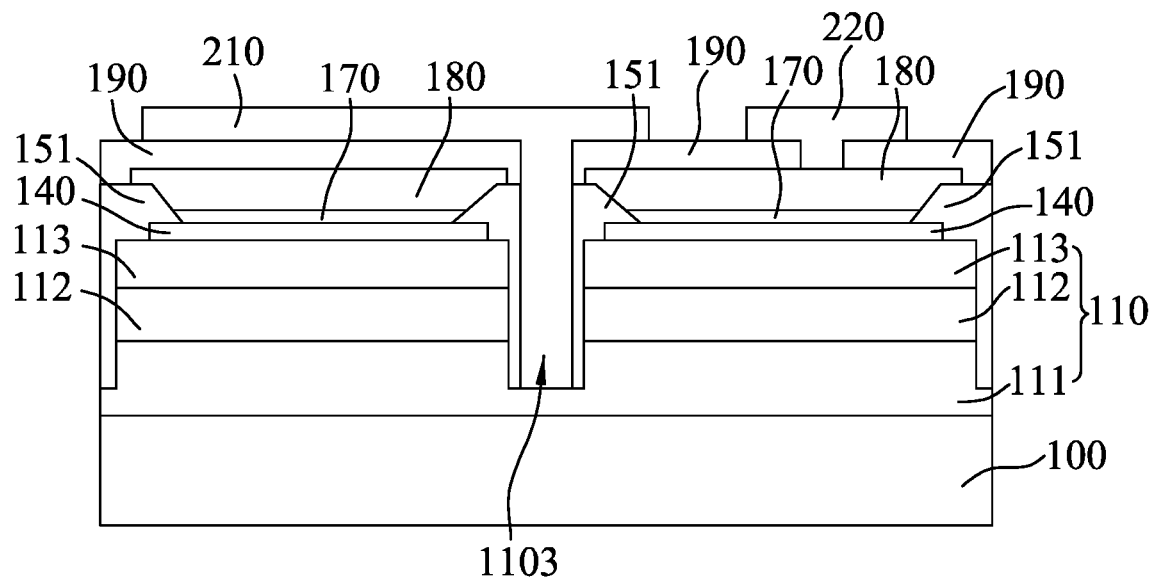
FIG. 11 is a cross-sectional view taken along line B-B of FIG. 10.

Referring to FIGS. 9 to 11, a second embodiment of the light-emitting device has a structure similar to that of the first embodiment except that the second insulating structure 152 and the through-holes 1521 are omitted.

In this embodiment, the inner tapered surface 151s of the first insulating structure 151 has a portion exposed from the first side surface 1701 of the reflective layer 170. The barrier layer 180 is disposed on a fifth top surface 1703 of the reflective layer 170, the exposed portion of the inner tapered surface 151s and the third top surface 1511 of the first insulating structure 151. To be specific, the barrier layer 180 has a second side surface 1801, a second bottom surface 1802 and a third bottom surface 1803, where the second side surface 1801 is connected to the second bottom surface 1802 and the third bottom surface 1803. The second side surface 1801 is in contact with the exposed portion of the inner tapered surface 151s of the first insulating structure 151, the second bottom surface 1802 is in contact with the fifth top surface 1703 of the reflective layer 170, and the third bottom surface 1803 is in contact with the third top surface 1511 of the first insulating structure 151. The second side surface 1801 has an obtuse angle (R) with respect to the second bottom surface 1802. Thus, the barrier layer 180 can suppress peeling of the reflective layer 170 from the first insulating structure 151, and has a good coverage on the first insulating structure 151.

FIG. 10 is a top view illustrating a positional relationship of the first insulating structures 151. The first insulating structure 151 is inside the dashed circles, only two of which are exemplified in FIG. 10. Referring to FIGS. 10 and 11, the second embodiment of the light-emitting device is configured as a flip-chip structure that is similar to that of the first embodiment, as shown in FIGS. 2 and 3, except that the second insulating structure 152 and the through-holes 1521 are omitted.

Figure 12:
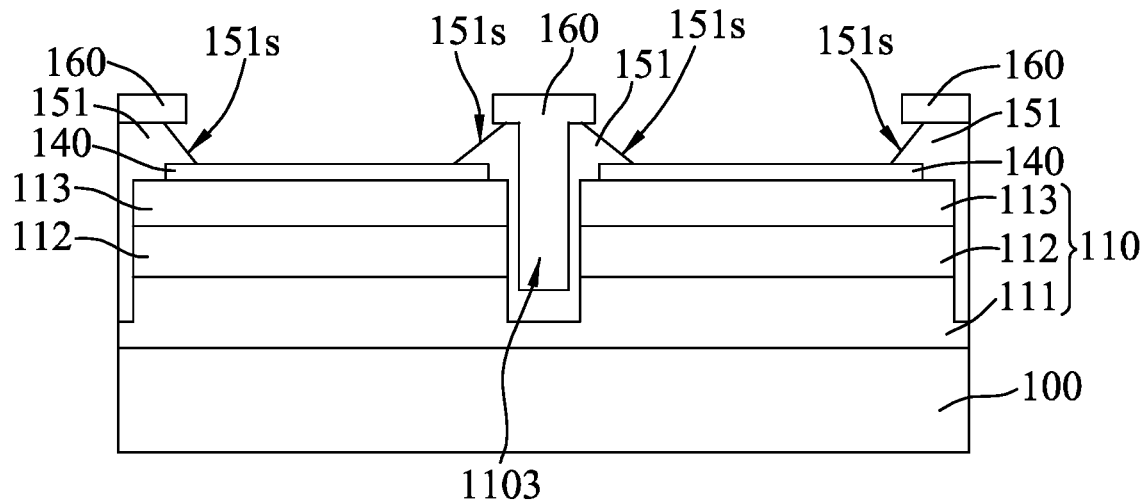
FIGS. 12 to 13 are schematic views illustrating consecutive steps of a method for manufacturing the second embodiment of the light-emitting device.

Referring to FIGS. 5 to 7, FIGS. 12 to 13 and FIG. 9, a method for manufacturing the second embodiment of the light-emitting device is similar to that of the first embodiment. To be specific, in this embodiment, steps Sa, Sb, Sc including Sc-1 to Sc-3 are similar to those described above with reference to FIGS. 5 to 7. However, in step Sc-4, the second portion 150b without being covered by the mask layer 160 is etched away to expose the transparent conductive layer 140, so that the second insulating structure 152 and the through-holes 1521 is not present, as shown in FIG. 12.

Figure 13:
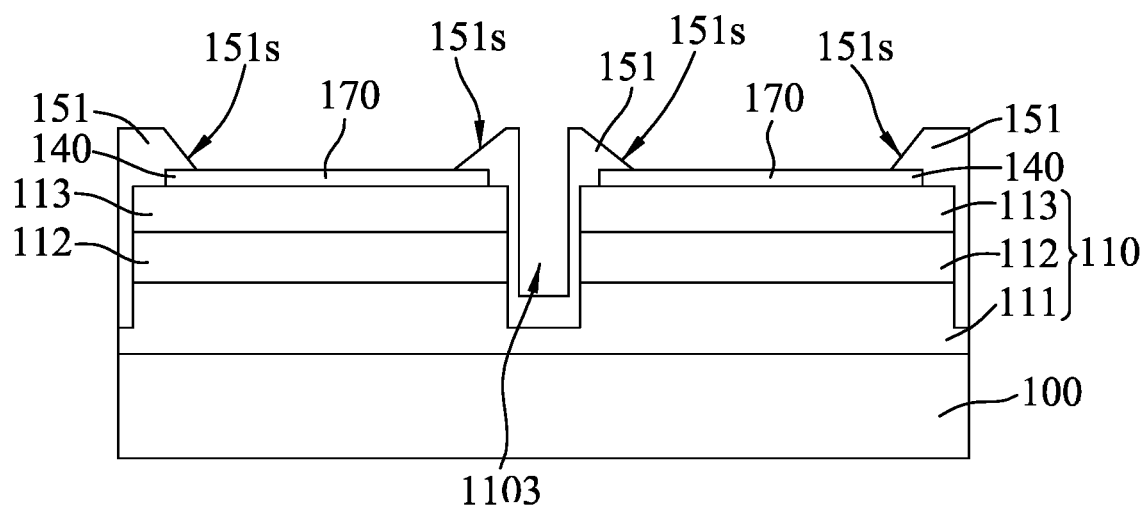

In step Sd, the mask layer 160 is first removed and then the reflective layer 170 is disposed on the first insulating structure 151 and the transparent conductive layer 140, as shown in FIG. 13.

In this embodiment, the method for manufacturing the light-emitting device may further include formation of the barrier layer 180, the passivation layer 190, the first and second electrodes 210, 220, as shown in FIG. 11, which is similar to those described above with reference to FIG. 3.

In some embodiments, the second embodiment of the light-emitting device may be also configured as a vertical structure that is similar to the vertical structure as shown in FIG. 4 except that the second insulating structure 152 and the through-holes 1521 are omitted.

In order to verify the performance of the embodiment of the light-emitting device with formation of the ODR, light output power (LOP) and forward voltage (VF) of examples of the first embodiment of the light-emitting device, which are formed with the ODR, and those of corresponding examples of the second embodiment, which are formed with no ODR, are compared and listed in Table 1.

TABLE 1

| Product Serial Number | ΔLOP | ΔVF |
|---|---|---|
| S-45 | +4.07% | +0.017 |
| S-55 | +3.34% | −0.013 |
| S-60 | +3.05% | −0.016 |

It can be seen that a difference of LOP (ΔLOP) between each of the examples of the first embodiment and the corresponding example of the second embodiment has a positive value and that a difference of VF (ΔVF) is close to zero. It is indicated that formation of the ODR will further improve reflectivity of the light-emitting device and that the electrical performance of the first embodiment of the light-emitting device formed with the ODR is kept stable.

Furthermore, by formation of the ODR, it is also revealed that peeling of the reflective layer 170 is avoided, that coverage of the reflective layer 170 on the insulating unit 150 and the transparent conductive layer 140 is favorable, and that brightness of final products including the light-emitting device is greatly improved, where brightness is positively related to LOP. Besides, photolithography used in the method for manufacturing the light-emitting device is controllable, and hence, there is little increase in production cost and reliability of final products is ensured, which is suitable for mass production.

Embodiment 3

Figure 14:
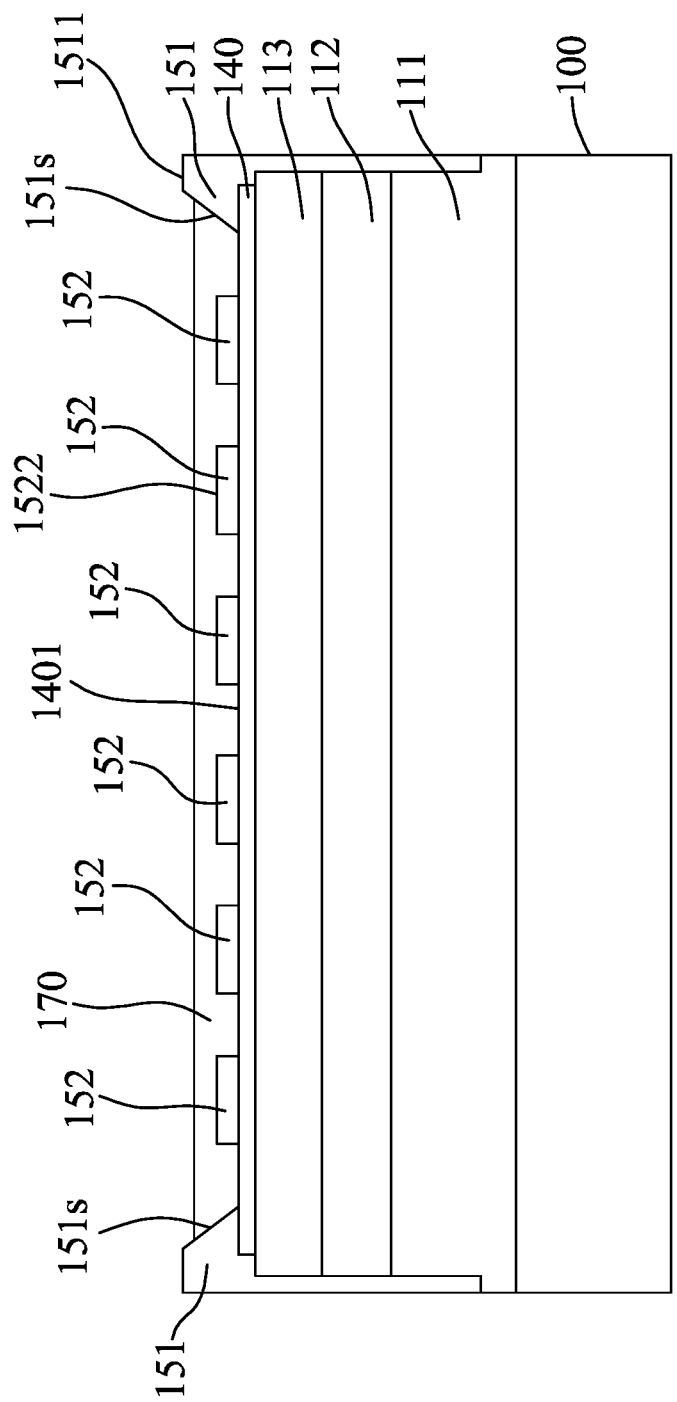
FIG. 14 is a schematic view illustrating a third embodiment of the light-emitting device of the disclosure.
Figure 15:
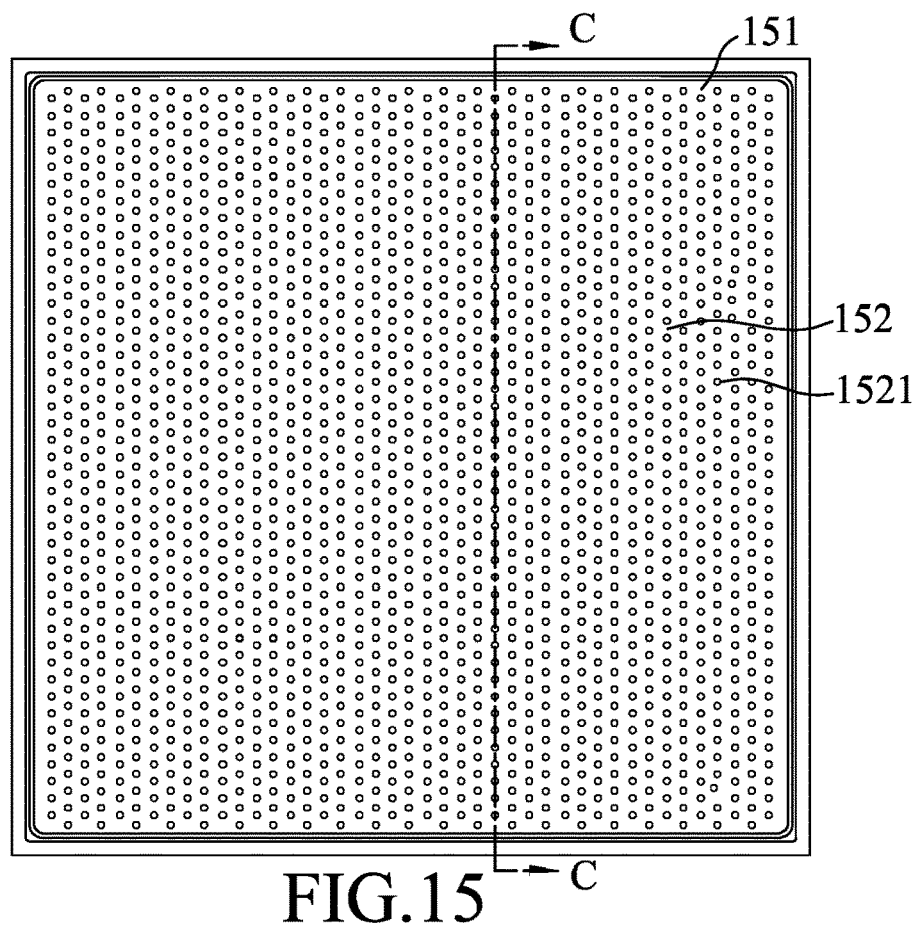
FIG. 15 is a top view of the third embodiment of the light-emitting device that is configured as a vertical structure.
Figure 16:
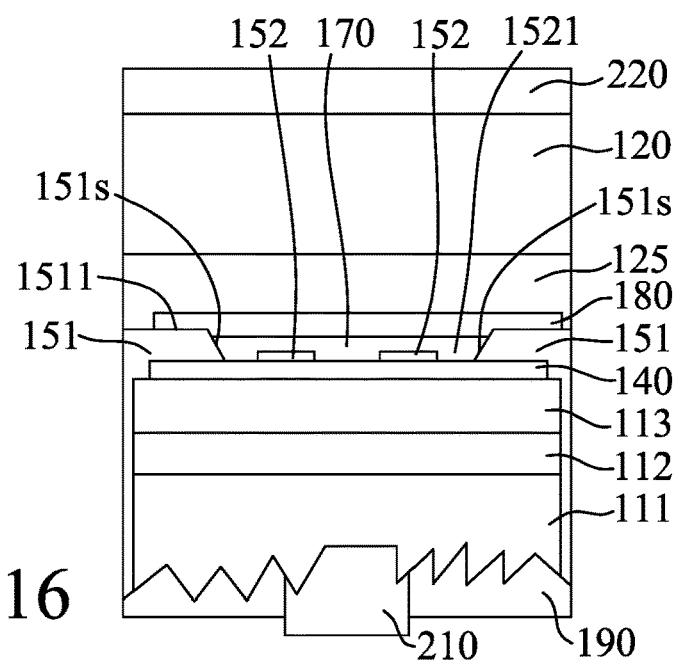
FIG. 16 is a cross-sectional view taken along line C-C of FIG. 15.

Referring to FIGS. 14 to 16, a third embodiment of the light-emitting device has a structure similar to that of the first embodiment except that the trenches 1103 are omitted.

In this embodiment, the second insulating structure 152 has a fourth top surface 1522 that has an altitude relative to the second top surface 1401 of the transparent conductive layer 140 which is lower than that of the third top surface 1511 of the first insulating structure 151.

In this embodiment, the light-emitting device is configured as a vertical structure, as shown in FIG. 16. Hence, referring to FIG. 15, a top view of the third embodiment of the light-emitting device is similar to that of the first embodiment, as shown in FIG. 2, except that the trenches 1103 are omitted, and that the first electrode 210 cannot be seen from this top view.

Referring to FIG. 16, the light-emitting device configured as the vertical structure further includes a metallic bonding layer 125 disposed on the barrier layer 180 and the third top surface 1511 of the first insulating structure 151 exposed from the barrier layer 180, the heat conductive layer 120 disposed on the metallic bonding layer 125, and the second electrode 220 disposed on the heat conductive layer 120. Materials suitable for forming the metallic bonding layer 125 include gold (Au), gold-tin alloys (AuSn), and tin-nickel alloys (SnNi), but are not limited thereto. Furthermore, compared with FIG. 14, the substrate 100 is removed to expose the first type semiconductor layer 111, and the passivation layer 190 is disposed on the first type semiconductor layer 111 opposite to the active layer 112 to expose a portion of the first type semiconductor layer 111 for the first electrode 210 to be electrically connected thereto.

In some embodiments, the third embodiment of the light-emitting device may be configured as a flip-chip structure.

Embodiment 4

Figure 17:
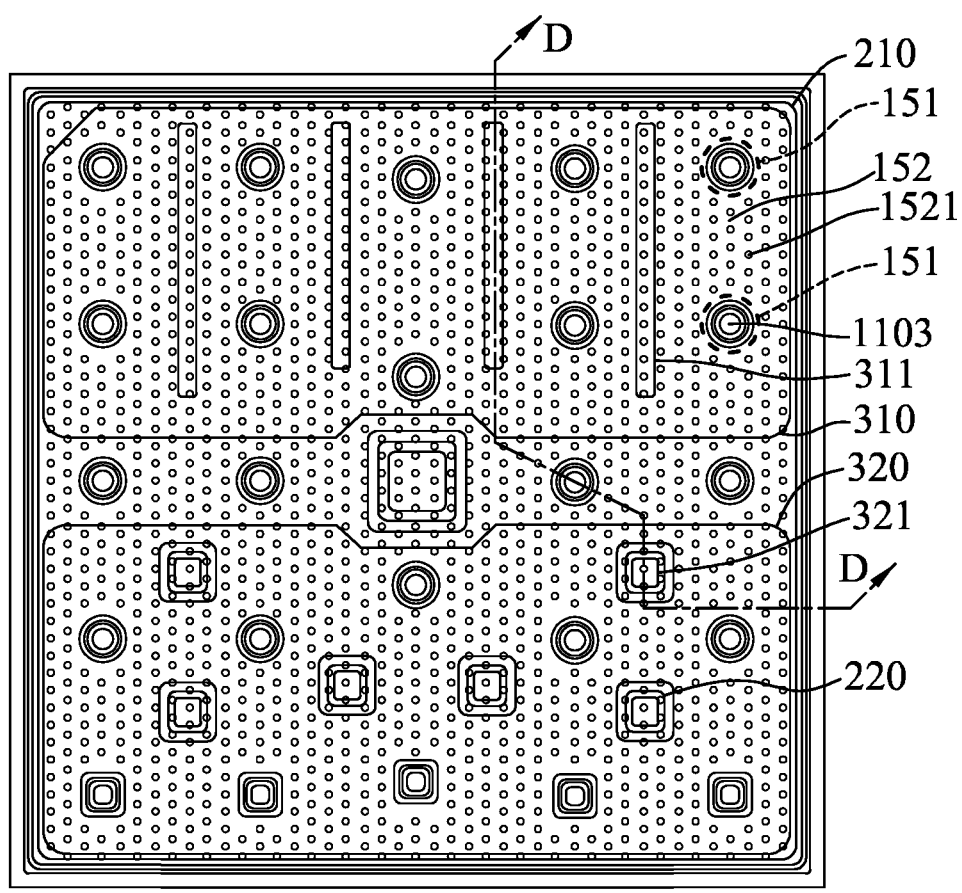
FIG. 17 is a top view of a fourth embodiment of the light-emitting device that is configured as a flip-chip structure.
Figure 18:
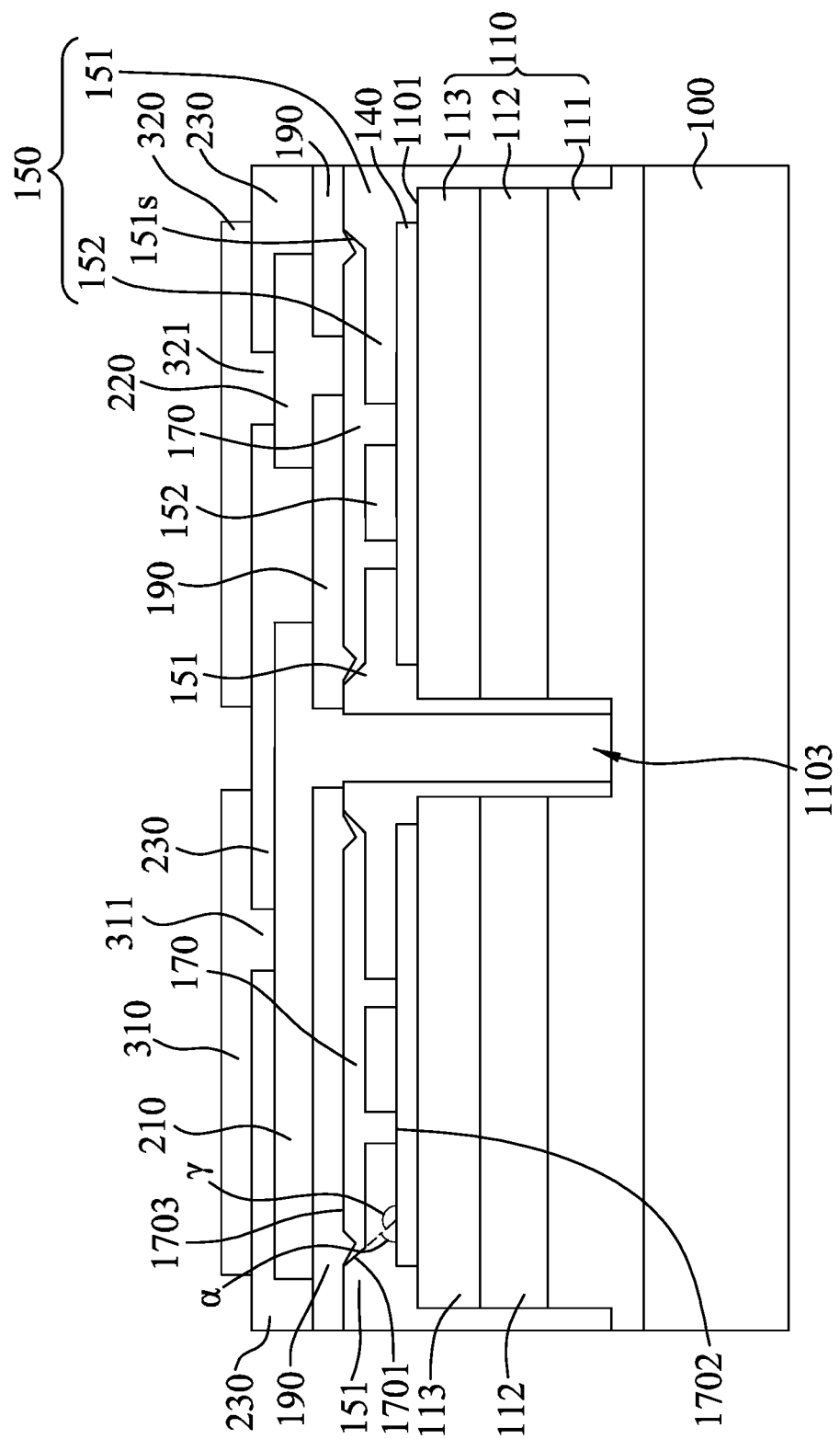
FIG. 18 is a cross-sectional view taken along line D-D of FIG. 17.

Referring to FIGS. 17 to 18, a fourth embodiment of the light-emitting device has a structure similar to that of the first embodiment. However, the reflective layer 170 has a V-shaped groove indented from the fifth top surface 1703 and adjacent to the inner tapered surface 151s. Besides, in order to further improve adhesion between the reflective layer 170 and the insulating unit 150 including the first insulating structure 151 and the second insulating structure 152, the reflective layer 170 is formed as a multi-layered structure. In this embodiment, the reflective layer 170 is formed with multiple sub-layers including a high reflectivity metallic layer (e.g., Ag layer), a first adhesion layer interposed between the insulating unit 150 and the high reflectivity metallic layer, a compressive stress layer and a second adhesion layer disposed on the high reflectivity metallic layer sequentially (the first adhesive layer, the compressive stress layer, and the second adhesive layer are not shown in figures).

Compared with FIG. 1, FIG. 18 illustrate a cross-sectional view of the light-emitting device where the most adjacent portion of the second insulating structure 152 is connected to the first insulating structure 151 so that the through-holes 1521 as shown are not located between the first insulating structure 151 and the second insulating structure 152.

In this embodiment, the insulating unit 150 has a refractive index less than that of the light-emitting mesa structure 110, and is made of an oxide material. For example, the insulating unit 150 may be made of an optical material that has a refractive index of less than 1.6, such as silicon oxide or magnesium fluoride.

In this embodiment, the insulating unit 150 is transparent to light emitting from the light-emitting mesa structure 110, so that the light emitting from the light-emitting mesa structure 110 is able to pass through the insulating unit 150 and can be reflected by the reflective layer 170. Furthermore, the insulating unit 150 has a refractive index of less than that that of the light-emitting mesa structure 110. Based on principle of reflection, light emitting from the light-emitting mesa structure 110 with a smaller angle of incidence may be refracted to reach the barrier layer 180 and the light with a larger angle of incidence may be total internal reflected. Therefore, a configuration including the insulating unit 150 and the reflective layer 170 has a higher reflectivity compared with a configuration including only the reflective layer 170.

In this embodiment, the transparent conductive layer 140 covers almost the entire first top surface 1101 of the light-emitting mesa structure 110 to ensure lateral spreading of current and lower driving voltage. To be specific, a projection area of the transparent conductive layer 140 on the first top surface 1101 of the light-emitting mesa structure 110 ranges from 80% to 98% of an area of the first top surface 1101 of the light-emitting mesa structure 110.

For ensuring efficiency of light extraction, the reflective layer 170 has a projection area on the first top surface 1101 of the light-emitting mesa structure 110 less than that of the transparent conductive layer 140. To be specific, in this embodiment, a projection area of the reflective layer 170 on the first top surface 1101 of the light-emitting mesa structure 110 is 50% to 95% of an area of the first top surface 1101 of the light-emitting mesa structure 110.

A conventional reflective layer is formed by steps including patterning a positive photoresist disposed on an insulating layer to expose a portion of the insulating layer, disposing a metallic reflective material on the exposed portion of the insulating layer and the patterned positive photoresist by sputtering, and removing the patterned positive photoresist and the metallic reflective material disposed thereon. Due to trapezoidal profile of the positive photoresist, a reserved space for disposing the metallic reflective material has a cross-sectional shape of an inverted trapezoid. After removing the patterned positive photoresist, a peripheral portion of the conventional reflective layer is relatively thinner and tends to be curved upward to form a V-shaped groove having an included angle of less than 90 degrees, resulting in breakage of subsequent film disposed thereon.

Based on the abovementioned characteristics of the conventional reflective layer, the first insulating structure 151 having the inner tapered surface 151s is provided. In this embodiment, the acute angle (α) of the inner tapered surface 151s of the first insulating structure 151 is less than 60 degrees so that the obtuse angle (γ) of the first side surface 1701 of the reflective layer 170 is larger than 120 degrees with respect to the first bottom surface 1702 of the reflective layer 170. Thereby, the V-shaped groove of the reflective layer 170 forms a larger included angle of no less than 90 degrees. The larger included angle of the V-shaped groove of the reflective layer 170 can suppress curling-up of a peripheral portion thereof, which is beneficial to subsequent film deposition especially on the peripheral portion of the reflective layer 170.

In some embodiments, the acute angle (α) of the inner tapered surface 151s of the first insulating structure 151 may be much smaller. For example, the acute angle (α) of the inner tapered surface 151s of the first insulating structure 151 is less than 30 degrees, so that the obtuse angle (γ) of the first side surface 1701 of the reflective layer 170 is larger than 150 degrees with respect to the first bottom surface 1702 of the reflective layer 170. Thereby, the included angle of the V-shaped groove of the reflective layer 170 as formed is larger than 120 degrees.

In this embodiment, the maximum thickness of the first insulating structure 151 ranges from 200 nm to 1200 nm. The thickness of the second insulating structure 152 ranges from one-third to two thirds of that of the first insulating structure 151.

In this embodiment, the contact area between the reflective layer 170 and the transparent conductive layer 140 ranges from 0.3% to 20% of the area of the first top surface 1101 of the light-emitting mesa structure 110. In some embodiments, the contact area between the reflective layer 170 and the transparent conductive layer 140 ranges from 0.5% to 5% of the area of the first top surface 1101 of the light-emitting mesa structure 110.

The first adhesion layer may be made of Ti, and may have a thickness ranging from 3 A to 50 A. The excessive thickness of the first adhesion layer may have adverse impact on reflectivity thereof.

The compressive layer has an area larger than that of the first adhesion layer 171 so as to be in contact with the first insulating structure 151. Consequently, the curling-up of the peripheral portion of the fifth top surface 1703 of the reflective layer 170 may be suppressed. The compressive layer may be made of a metallic alloy, such as TiW, and may have a thickness ranging from 20 nm to 300 nm.

The second adhesion layer may be made of the same material as that of the first adhesion layer, such as Ti. However, in order to improve adhesion between the reflective layer 170 and the insulating unit 150, the second adhesion layer may have an area larger than that of the compressive layer so as to be in contact with the first insulating structure 151, and may have a thickness which is greater than that of the compressive layer and which may range from 50 nm to 300 nm.

In this embodiment, the light-emitting device also includes the barrier layer 180 (not shown in figures) that may suppress thermal diffusion or electromigration of Ag or Al in the reflective layer 170 and that may improve reflectivity of the reflective layer 170.

A method for manufacturing the fourth embodiment of the abovementioned light-emitting device includes consecutive steps Sa' to Sd', as shown in FIGS. 19 to 22.

In step Sa', the light-emitting mesa structure 110 formed with a plurality of the trenches 1103 is provided. Details regarding the formation of the light-emitting mesa structure 110 is similar to those described above with reference to FIG. 5.

Figure 19:
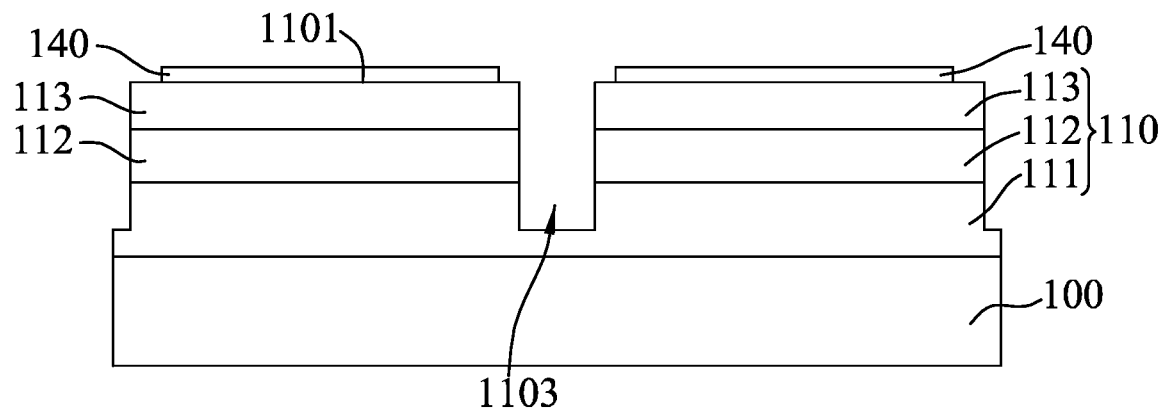
FIGS. 19 to 24 are schematic views illustrating consecutive steps of a method for manufacturing the fourth embodiment of the light-emitting device.

In step Sb', the transparent conductive layer 140 is disposed on the first top surface 1101 of the light-emitting mesa structure 110, as shown in FIG. 19. In this embodiment, details regarding the formation of the transparent conductive layer 140 is similar to those described above with reference to FIG. 5 except that the area of the transparent conductive layer 140 is larger than that of the reflective layer 170 subsequently disposed thereon.

Figure 20:
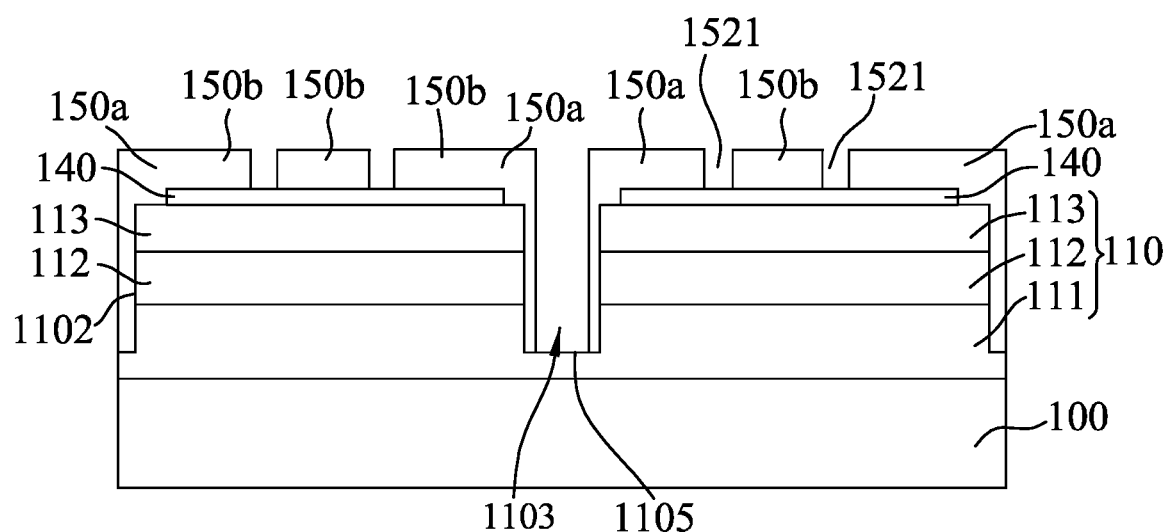
Figure 21:
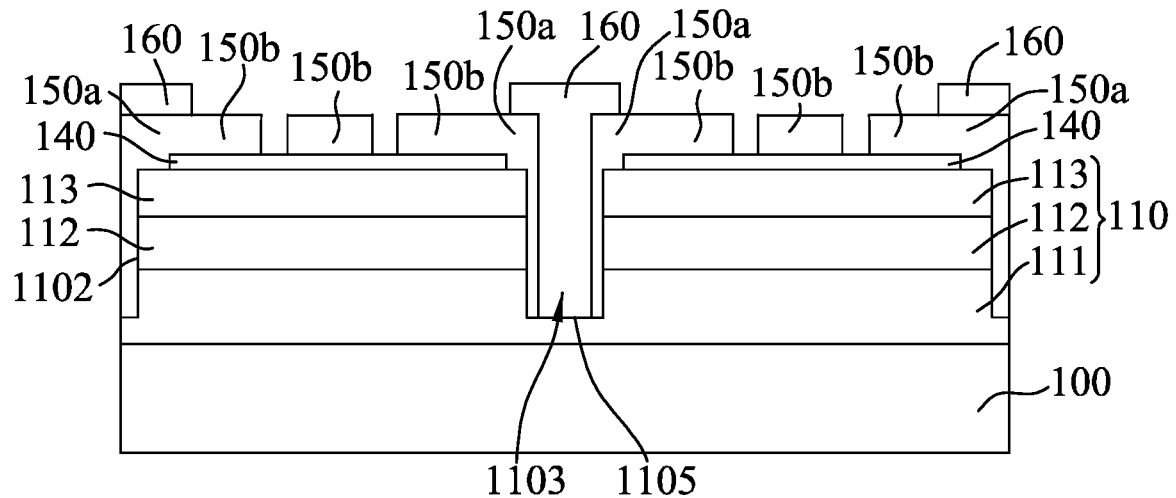
Figure 22:
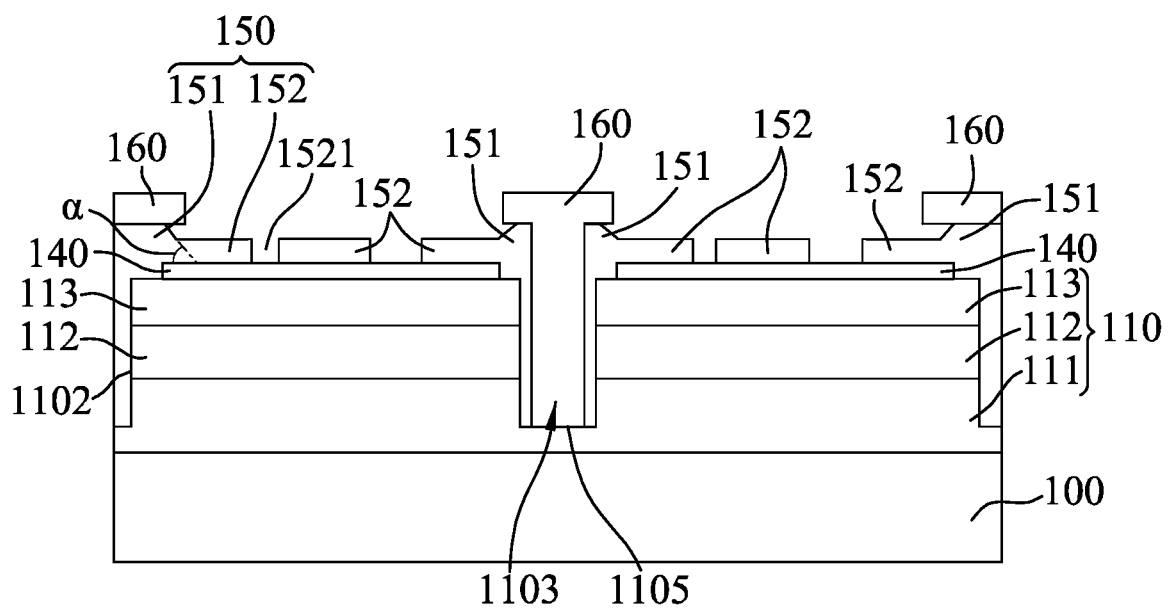

In step Sc', the insulating unit 150 is formed on the peripheral surface 1102 of the light-emitting mesa structure 110 and on the transparent conductive layer 140 to expose the portion of the transparent conductive layer 140 and the bottom 1105 of each of the trenches 1103, as shown in FIGS. 20 to 22. In this embodiment, step Sc' includes Sc-1' to Sc-4' which involves formation of the insulating unit 150 and details thereof are similar to steps Sc-1 to Sc-4 as described above with reference to FIGS. 6 to 8, except for the differences described hereinafter.

In step Sc-1', the insulating layer is made of silicon dioxide (SiO$_2$).

In step Sc-2', the wet etching process using BOE solution or the dry etching process including inductively-coupled-plasma (ICP) etching, is used to form the through-holes 1521 of the second insulating structure 152 and to remove the insulating layer disposed on the bottom 1105 of each of the trenches 1103, as shown in FIG. 20. Each of the through-holes 1521 has a width ranging from 2 μm to 50 μm. The total area of the through-holes 1521 ranges from 3% to 50% of the area of the light-emitting mesa structure 110.

In step Sc-4', the patterned insulating layer is etched along the mask layer 160 to form the second insulating structure 152 and the first insulating structure 151, as shown in FIG. 22. The acute angle (ca) of the inner tapered surface 151s of the first insulating structure 151 is less than 60 degrees by tuning etching duration of the wet etching process using BOE solution.

Figure 23:
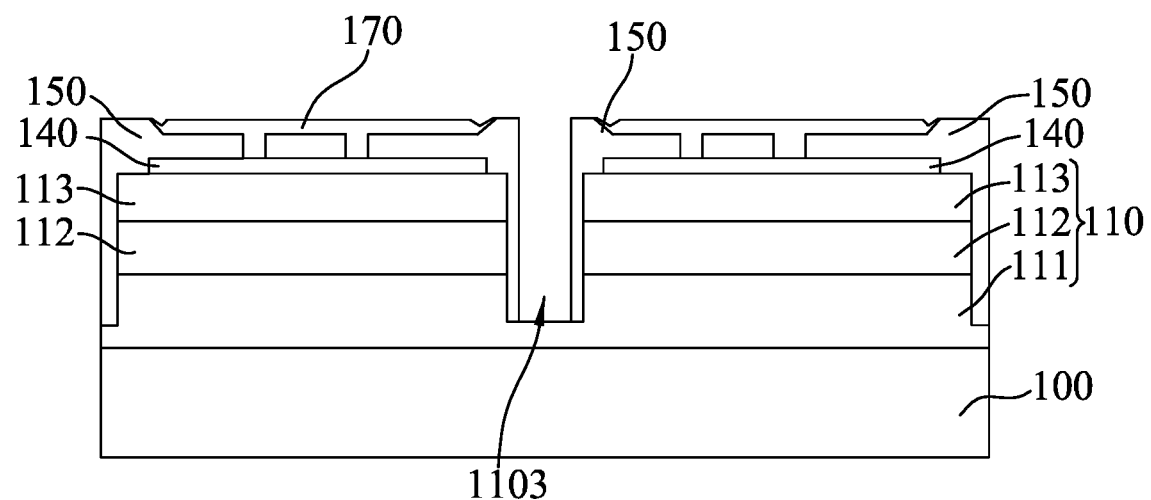

In step Sd', the reflective layer 170 is disposed on the insulating unit 150 and the exposed portion of the transparent conductive layer 140, as shown in FIG. 23. In this embodiment, details regarding formation of the reflective layer 170 are similar to step Sd as described above with reference to FIG. 1.

Specifically, for further improving adhesion between the reflective layer 170 made of Ag and the insulating unit 150 made of $SiO_2$, the first adhesion layer is disposed on the insulating unit 150 and the exposed portion of the transparent conductive layer 140 prior to the deposition of the reflective layer 170. Furthermore, the compressive stress layer made of TiW and the second adhesive layer made of Ti are further disposed on the reflective layer 170 in such order after the mask layer 160 is removed. The second adhesive layer has a thickness ranging from 50 A to 2000 A.

Figure 24:
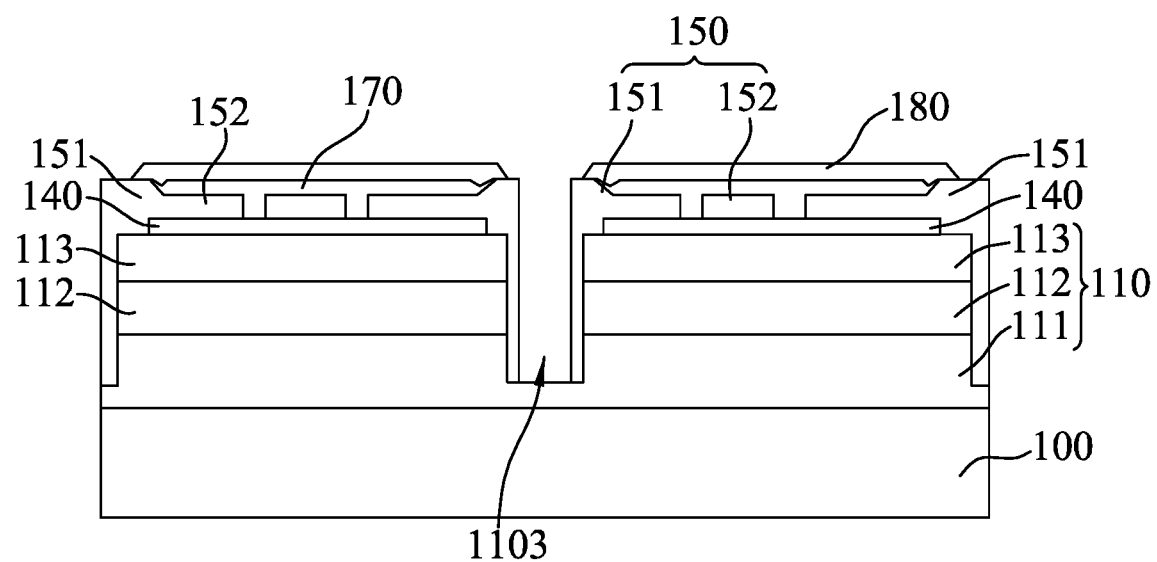

In this embodiment, the method for manufacturing the light-emitting device further includes disposing the barrier layer 180 on the reflective layer 170, as shown in FIG. 24. The area of the barrier layer 180 is larger than those of the reflective layer 170 and the second adhesion layer so as to be in contact with the first insulating structure 151. The reflectivity of the barrier layer 180 increases by 2% after annealing.

In this embodiment, the method for manufacturing the light-emitting device further includes formation of the passivation layer 190, and the first and second electrodes 210, 220, which is similar to those described above with reference to FIG. 3, except for the differences described hereinafter.

A third adhesive layer that is made of Ti may be disposed on the barrier layer 180 for improving adhesion between the barrier layer 180 and the passivation layer 190 subsequently disposed thereon. The third adhesive layer is annealed for oxidation so as to improve adhesion of the barrier layer 180 to the passivation layer 190.

In this embodiment, the method for manufacturing the light-emitting device further includes forming a protection layer 230 on the first and second electrodes 210, 220, forming a first via 311 and a second via 321 to expose a portion of the first electrode and a portion of the second electrode 210, 220, respectively, disposing a first bonding pad 310 on the protection layer 230 to be electrically connected to the first electrode 210 by the first via 311, and disposing a second bonding pad 310 on the protection layer 230 to be electrically connected to the second electrode 220 by the second via 321. The second bonding pad 310 is spaced apart from the first bonding pad 310, as shown in FIG. 18.

To sum up, based on the abovementioned light-emitting device and the method for manufacturing the same of this disclosure, peeling off and insufficient coverage of the reflective layer 170 can be avoided.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting device, comprising:
a light-emitting mesa structure having a first top surface and a peripheral surface connected to said first top surface;
a transparent conductive layer disposed on said first top surface of said light-emitting mesa structure, said transparent conductive layer having a second top surface;
a first insulating structure at least disposed on said peripheral surface of said light-emitting mesa structure, said first insulating structure having a third top surface and an inner tapered surface indented from said third top surface, said inner tapered surface defining an acute angle with respect to a portion of said second top surface of said transparent conductive layer under said inner tapered surface; and
a reflective layer disposed on said transparent conductive layer, said reflective layer having a first side surface in contact with said inner tapered surface of said first insulating structure,
wherein the light-emitting device further comprises a second insulating structure disposed on said transparent conductive layer to be connected to said first insulating structure, said second insulating structure being formed with a plurality of through-holes, said reflective layer extending through said through-holes to be electrically connected to said transparent conductive layer,
wherein said second insulating structure has a thickness less than a maximum thickness of said first insulating structure,
wherein said reflective layer has a thickness no greater than a maximum thickness of said first insulating structure, and
wherein said reflective layer is not overlapping said third top surface in a direction perpendicular to said third top surface of said first insulating structure.

2. The light-emitting device of claim 1, wherein
said transparent conductive layer is disposed on a first region of said first top surface of said light-emitting mesa structure, and
said first insulating structure has a main portion surrounding said peripheral surface of said light-emitting mesa structure and
a lateral portion extending from said main portion, said lateral portion being disposed on a second region of said first top surface of said light-emitting mesa structure, said lateral portion being peripherally disposed on said second top surface of said transparent conductive layer, said lateral portion defining said inner tapered surface.

3. The light-emitting device of claim 1, wherein said second insulating structure has a fourth top surface having an altitude relative to said second top surface of said transparent conductive layer, said fourth top surface being at a level lower than a level of said third top surface of said first insulating structure.

4. The light-emitting device of claim 1, wherein said second insulating structure has a thickness less than two-thirds of the maximum thickness of said first insulating structure.

5. The light-emitting device of claim 1, wherein said reflective layer has a first bottom surface in contact with said second top surface of said transparent conductive layer, said first bottom surface being connected to said first side surface, said acute angle being less than 60 degrees, said first side surface of said reflective layer defining an obtuse angle of larger than 120 degrees with respect to a portion of said second top surface of said transparent conductive layer under said reflective layer.

6. The light-emitting device of claim 5, wherein said acute angle is less than 30 degrees, said first side surface of said reflective layer defining an obtuse angle of larger than 150 degrees with respect to a portion of said second top surface of said transparent conductive layer under said reflective layer.

7. The light-emitting device of claim 1, further comprising a barrier layer disposed on said reflective layer, said barrier layer having a second side surface, a first region of said inner tapered surface of said first insulating structure being covered by said first side surface of said reflective layer, said second side surface being in contact with a second region of said inner tapered surface of said first insulating structure.

8. The light-emitting device of claim 7, wherein said barrier layer is formed as a metallic single-layer structure or a metallic multi-layered structure.

9. The light-emitting device of claim 7, wherein said barrier layer has a second bottom surface in contact with said reflective layer, said second side surface defining an obtuse angle with respect to said second bottom surface.

10. The light-emitting device of claim 1, wherein said reflective layer further has a fifth top surface and a V-shaped groove indented from said fifth top surface and adjacent to said inner tapered surface.

11. The light-emitting device of claim 10, wherein said V-shaped groove forms an included angle of no less than 90 degrees.

12. The light-emitting device of claim 11, wherein said V-shaped groove forms an included angle of larger than 120 degrees.

13. The light-emitting device of claim 1, wherein said light-emitting mesa structure is formed with a plurality of trenches, said trenches being indented from said first top surface, each of said trenches having an inner sidewall connected to said first top surface, said first insulating structure being further disposed on said inner sidewall of each of said trenches.

14. The light-emitting device of claim 13, wherein said light-emitting mesa structure includes a first type semiconductor layer, an active layer disposed on said first type semiconductor layer, and a second type semiconductor layer disposed on said active layer opposite to said first type semiconductor layer, said second type semiconductor layer defining said first top surface opposite to said active layer, each of said trenches extending through said second type semiconductor layer and said active layer and terminating at said first type semiconductor layer.

15. The light-emitting device of claim 1, wherein said reflective layer is formed as a metallic single-layer structure or a metallic multi-layered structure.

* * * * *